United States Patent [19]
Reuland

[11] 3,979,581
[45] Sept. 7, 1976

[54] METHOD AND ARRANGEMENT FOR DETERMINING THE MASS OF TOBACCO OR THE LIKE BY CAPACITANCE AND ATTENUATION MEASUREMENTS IN A RESONANT HIGH FREQUENCY OSCILLATOR CIRCUIT

[75] Inventor: Joachim Reuland, Hamburg, Germany

[73] Assignee: Hauni-Werke Körber & Co., KG, Hamburg, Germany

[22] Filed: Feb. 24, 1975

[21] Appl. No.: 552,047

[30] Foreign Application Priority Data
Feb. 26, 1974 Germany............................ 2409102

[52] U.S. Cl. ........................ 235/151.33; 324/61 R; 73/73; 235/151.35
[51] Int. Cl.² .................. G01R 27/26; G06F 15/20
[58] Field of Search ................. 235/151.33, 151.35, 235/151.3, 151.13; 73/73, 32 R; 324/61 R

[56] References Cited
UNITED STATES PATENTS

| 2,767,717 | 10/1956 | Schlossmacher | 131/136 |
|---|---|---|---|
| 3,320,528 | 5/1967 | Esenwein | 324/61 R |
| 3,327,207 | 6/1967 | Norwich | 324/61 R |
| 3,372,488 | 3/1968 | Koch et al. | 131/136 X |
| 3,392,349 | 7/1968 | Bartley | 324/61 R |
| 3,482,162 | 12/1969 | Wochnowski | 324/61 R |
| 3,504,280 | 3/1970 | Byrd | 324/61 R |
| 3,508,435 | 4/1970 | Ivy | 73/73 X |
| 3,618,368 | 11/1971 | Lesemann | 73/73 |
| 3,684,953 | 8/1972 | Grant | 324/61 R |
| 3,769,581 | 10/1973 | Konig et al. | 235/151.33 X |

*Primary Examiner*—Edward J. Wise
*Attorney, Agent, or Firm*—Peter K. Kontler; John Kurucz

[57] ABSTRACT

The material whose mass is to be determined is transported along a predetermined path. At a measurement station it forms the dielectric of a capacitor which is part of a high-frequency oscillator circuit. The capacitance of the capacitor and the attenuation of the high-frequency oscillator circuit at resonance are measured and the mass of the material, such as tobacco, is automatically calculated by means of an nth degree polynomial whose constants are stored in the computer and whose variables are the signals corresponding to the resonant attenuation and capacitance. The mass of a substance, such as moisture, associated with the tobacco is calculated similarly, but utilizing different constants. The polynomials can be expanded to include temperature terms. The computed mass and moisture values can be utilized, after comparison with suitable reference signals, to control the mass of the material moving along the path as well as the quantity of substances associated therewith (for example, tobacco and mosture).

33 Claims, 10 Drawing Figures

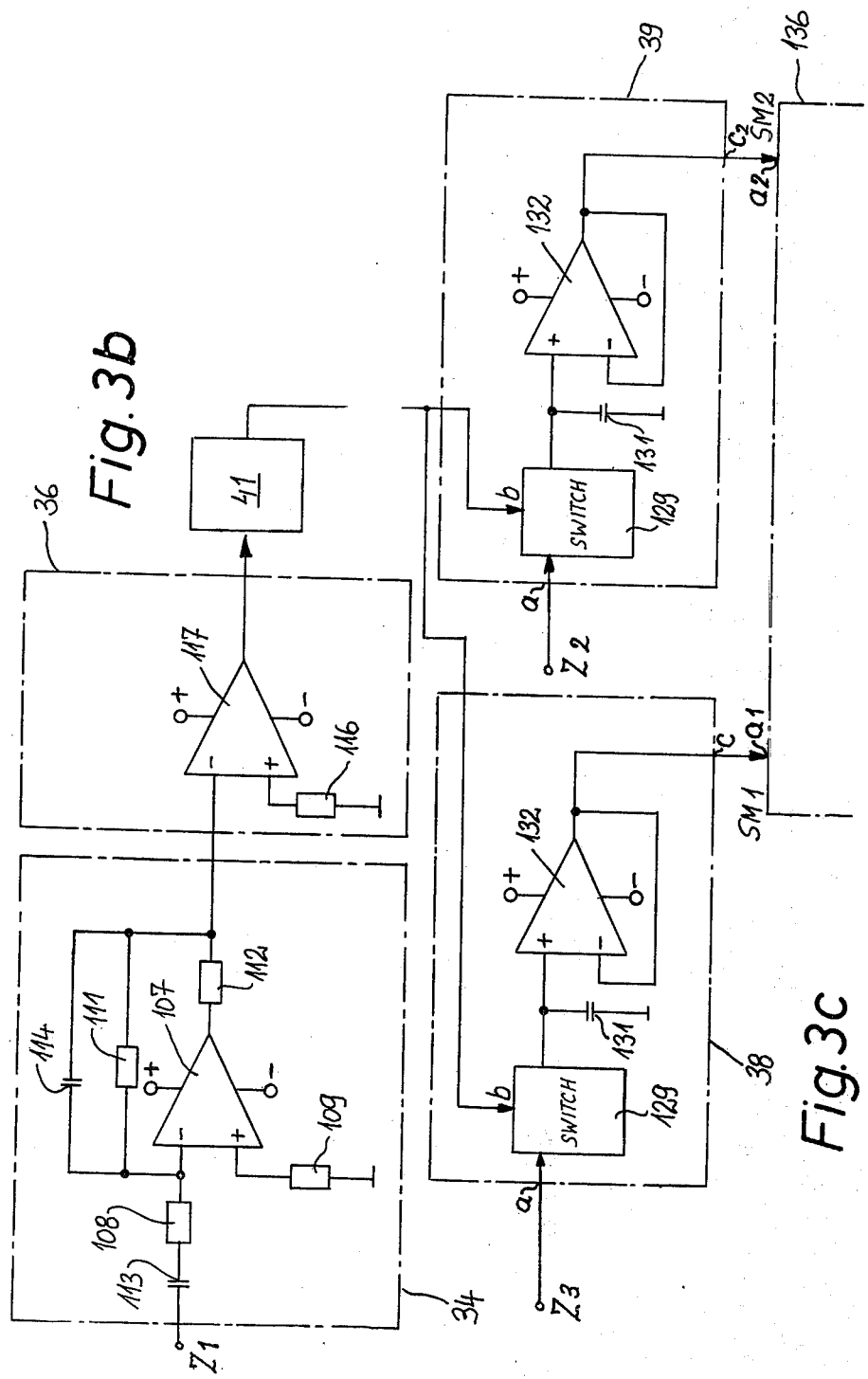

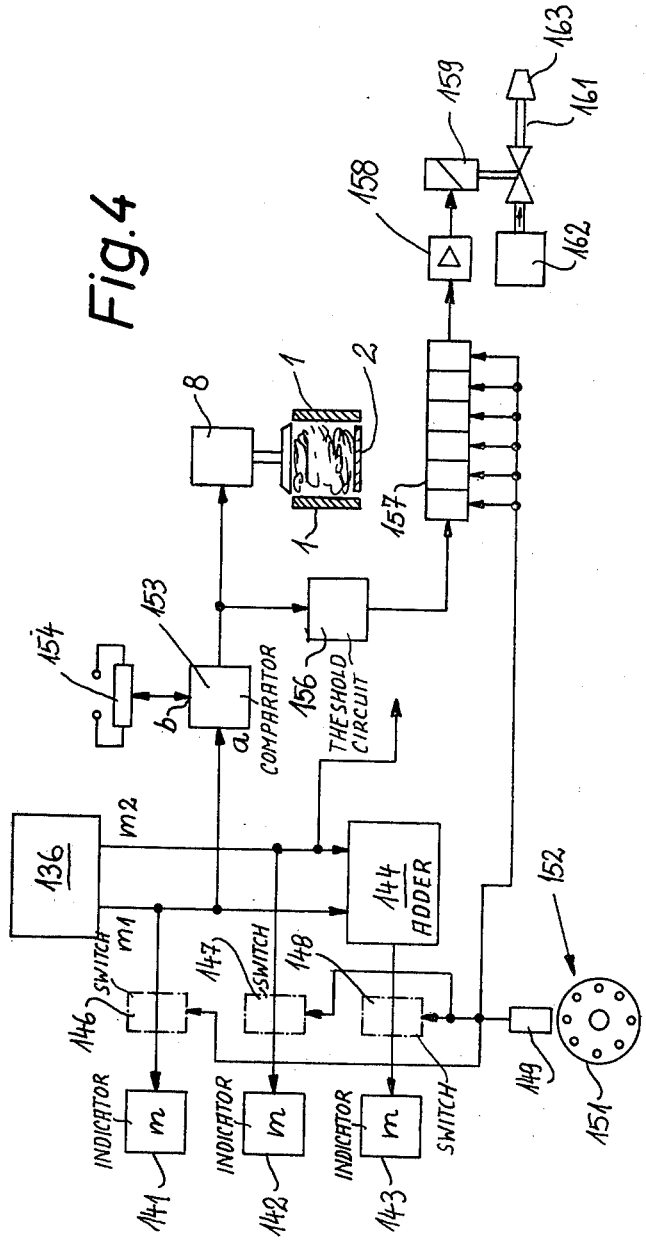

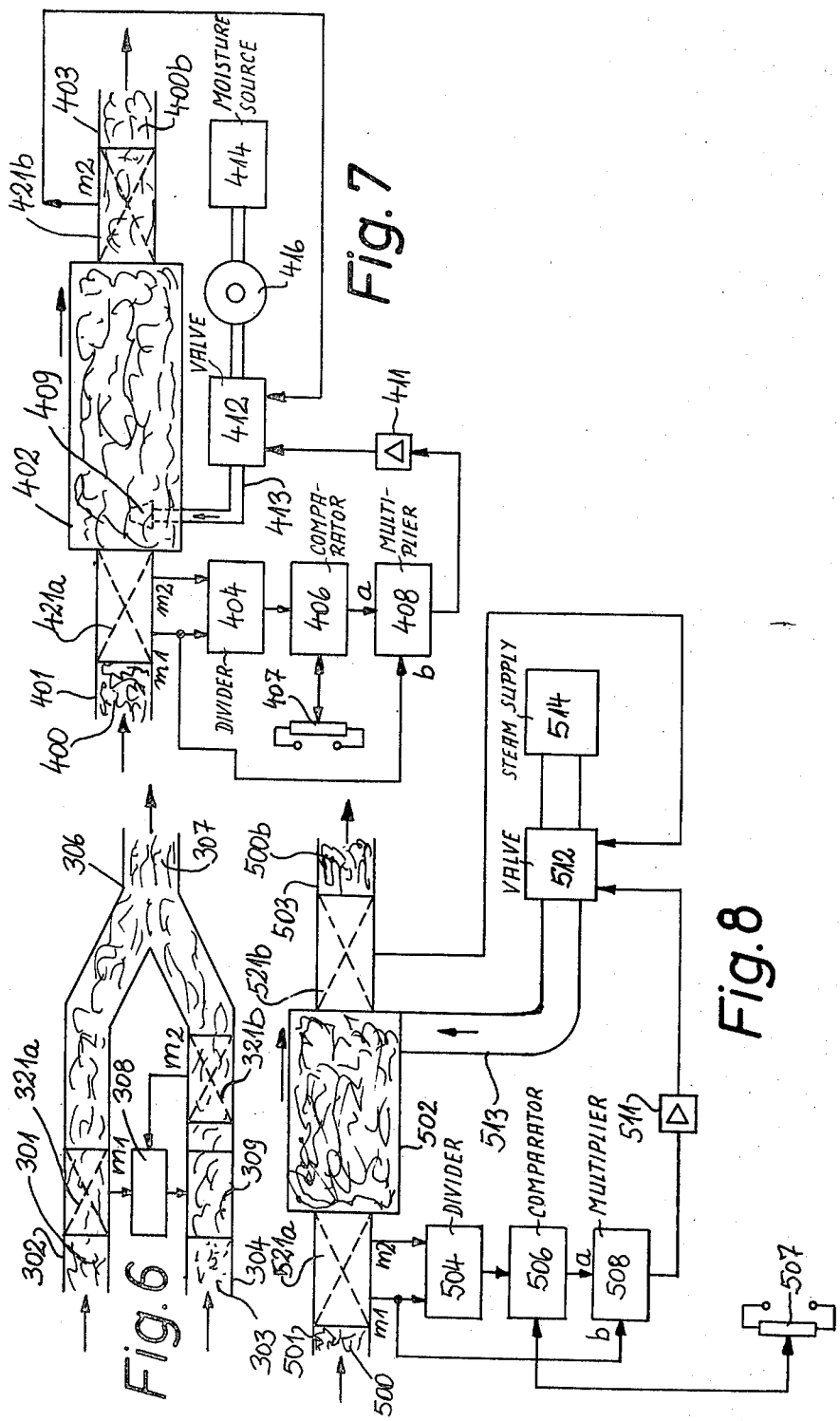

METHOD AND ARRANGEMENT FOR DETERMINING THE MASS OF TOBACCO OR THE LIKE BY CAPACITANCE AND ATTENUATION MEASUREMENTS IN A RESONANT HIGH FREQENCY OSCILLATOR CIRCUIT

BACKGROUND OF THE INVENTION

The present invention relates to a method and apparatus for computing the mass of tobacco or other material in the tobacco processing industry. In particular it relates to such method and arrangement when the material forms the dielectric of a capacitance in a high-frequency oscillator circuit.

In a conventional system, the tobacco in the form of a cigarette strand forms at least part of the dielectric of a capacitor in a high-frequency oscillator circuit. Changes in the resonant frequency of the circuit, which correspond to changes in the capacitance due to changes in the mass of tobacco, are used to form a signal signifying said mass. U.S. Pat. No. 2,519,089 shows such a measuring arrangement for shredded tobacco whose relative moisture is never less than predetermined minimum value during its processing in a cigarette making machine. This type of arrangement operates correctly only as long as the relative moisture content of the tobacco is assumed to remain constant. However when this relative moisture content changes the results are incorrect. This strong dependence of the capacitive measurement on the moisture content is used in U.S. Pat. No. 3,320,528 to determine the moisture content in a stream of tobacco. This is done by keeping the mass constant so that only the relative moisture content can affect the measurement value.

Thus both of the above methods are ineffective if one of the parameters, that is either the mass or the relative moisture cannot be held constant.

Capacitive measurement arrangements for tobacco are very simple to implement, small in structure and not subject to undesirable conditions such as radiation. Therefore much experimentation has gone on with so-called multifrequency methods in which it was desired to obtain specific measurement results by choice of characteristic frequencies which might result in a correct computation of the mass and the associated moisture in the tobacco. However, none of these have proved successful.

SUMMARY OF THE INVENTION

It is an object of the present invention to furnish a capacitive type of measuring arrangement and method for determining the mass of tobacco or some other material in the tobacco processing industry, which is independent of the moisture content.

In accordance with the present invention, the mass of the material forms at least part of the dielectric of a capacitor in a high-frequency oscillator circuit. The attenuation and the capacitance of the high-frequency oscillator circuit at resonance are measured and a corresponding attenuation and capacitance signal are furnished. The mass signal signifying the mass of the material constituting the dielectric is then computed as a function of the attenuation and capacitance signals.

The high-frequency oscillator circuit can be an actual active oscillator or, alternatively, can be the passive element such as a filter circuit which attenuates frequencies below and above the resonant frequency, the attenuation in both directions increasing with distance from the resonant frequency.

In exactly the same way in which the mass of the tobacco or other material can be measured as above, the mass of the substance associated with said material and therefore also forming part of the dielectric of the capacitor can be determined as a function of the capacitance and attenuation of the high-frequency oscillator.

The phrase "associated with" is used, not in the chemical sense of a combination, but in the sense of a physical mixture. The main, but not the only case to be considered of such a physical mixture is moisture (associated substance) which is contained in or on the tobacco or other material. The moisture, where tobacco is concerned, is mostly water to which substances for enhancing the taste may be added. When the material is filter material, the associated moisture can, for example, be a softener.

The capacitance measurements, in a preferred embodiment of the present invention, are obtained as a function of the resonant frequency of the high-frequency oscillator circuit. Specifically, at resonance, a discriminator circuit furnishes a voltage corresponding to the resonant frequency. The voltage constitutes the capacitance signal. The attenuation signal is furnished by determining the amplitude of the voltage across the high-frequency oscillator circuit at resonance. The so-furnished capacitance and attenuation signals form the basis for determining the mass signal. Both the mass of the tobacco and the mass of the associated substance such as moisture can be calculated as nth degree polynomials using stored constants and the measured capacitance and attenuation signals.

Any temperature effects can be eliminated by measuring the temperature in the mixture and adding terms utilizing the so-measured temperature to the nth degree polynomials.

As already explained, the invention is particularly suitable for determining the relative or absolute moisture content of a particular material, such as tobacco or filter material.

In many continuously operative production set-ups of the tobacco industry, the problem arises that the mass of the material (tobacco or other material) is transported in a continuous stream and that the mass in said stream must be controlled in accordance with the measured mass values. This constitutes a particularly desirable application of the present invention. Examples of such application are the preparation and processing of tobacco or other material to finished tobacco products, in particular in production equipment which operates on tobacco strands. The mass signal furnished by the present invention can be utilized in many different ways. For example in a preferred embodiment of the present invention it can be used to indicate such values as the mass corresponding to the final products as cigarettes, cigarillos, cigars, etc. which are formed by cutting the strand. Further, in other preferred embodiments, the mass signals can be utilized for particular portions of the continuously flowing tobacco stream such as the portions which later form the ends of the finished product and whose correct filling with tobacco or other material is particularly important. The mass signals furnished by the present invention can also be used for classification so that the mass signals lying within certain limited regions may be summed up so that the distribution of mass in this stream may be determined.

In a further preferred embodiment of the present invention, the mass signal which has been measured is compared to a reference signal and a control signal formed as a function of the difference therebetween. This control signal can for example cause portions which do not have a mass corresponding to a suitable standard to be removed from further processing. Further, the ratio of tobacco to another substance (in particular moisture) can be controlled by conditioning the tobacco also as a function of a so-generated control signal. Thus tobacco material can be either dried or additional moisture can be added. Such control of course is particularly important in the manufacture of cigarettes wherein the regulation of moisture content is of primary importance. The actual mass of tobacco can of course also be controlled by utilization of the control signal. The amount of tobacco inclusive of the moisture content, can of course be readily adjusted in a stream of shredded tobacco by removal of the excess amounts. When the tobacco is being prepared the mass in the stream can be similarly controlled. It is of course also possible to control two streams of tobacco in dependence of the signals furnished by the present invention in such a manner that the dry weight of the two has a desired ratio.

The computing means which form a part of the present invention, namely the part which calculates the mass signal on the basis of the measured capacitance and attenuation signals, comprises a storage unit holding a plurality of constants. These have been determined experimentally, both as coefficients for the capacitance and for the attenuation signals. These constants thus form the coefficients for increasing powers of the variables, namely the capacitance and attenuation signals.

Since temperature can have a great effect on the capacitive determination of the mass of a material, the temperature effects are eliminated in a further preferred embodiment of the present invention. In this case the computing means are adapted to compute a polynomial not only containing the variables of the attenuation signal and the capacitance signal, but also containing a variable corresponding to the temperature signal. Constants for increasing powers of the temperature variable are also stored in the computing means. A very important field of application of the present invention is the moisture measuring field. In this case the moisture constitutes the additional substance whose mass can also be determined. Such equipment of course is particularly useful where the relative moisture of a material must be kept within very exact balance either because of its further processing, its final usefulness or because of legal regulations. Thus in particular in the tobacco industry where tobacco products such as tobacco or cigarettes, cigarillos or cigars which are sold either too moist or too dry will invariably result in a negative reaction from the consumer. Either the resulting product will burn too rapidly or else it will swell and will not "draw" in the accustomed manner. Further, the machines which are utilized in the production of tobacco products are very sensitive to moisture, particularly in shredded tobacco. Thus it has always been an aim of the tobacco industry to keep the moisture content very close to the desired value. The particular degree of moisture is of course dependent upon the particular application. It must be noted that the (dry) mass of the tobacco and the mass of the moisture influence the measured results in a capacitive measuring arrangement such as the present differently. It is of course desirable to furnish the two mass signals, that is the signal corresponding to the mass of the related substance and that of the main material, separately since for most applications such separate measurement signals are required. Addition of the two signals of course will lead to the total mass of the tobacco including its then present moisture content that is effectively the weight of the finished product. Such a signal is particularly useful when the tobacco is being processed in a continuous stream whose mass must be kept within certain limits or whose ratio to other materials (other types of tobacco, additives) must be controlled. The control can be carried out independently of variations in moisture content with relation to a tobacco mass having a predetermined moisture content. The absolute moisture which is contained in a determined mass of tobacco can also serve as the starting point. A corresponding control signal which corresponds to the absolute value of the amount of moisture to be added or substracted can then be used as a control signal for valves which control the additional moisture or the amount of heat required for drying the tobacco. When the mass of tobacco in a stream is to be controlled under the action of an element which continually removes more or less of tobacco from the steam, this element can be activated in accordance with a signal which indicates the deviation of the actual mass from the desired mass having a predetermined fixed moisture content. The control signal can also be derived in dependence on the mass of tobacco in a first stream and be used to control the mass in a second stream in such a manner that a desired ratio exists between the two streams.

Again, it is possible to choose particular portions of the tobacco stream for special monitoring. These may for example be those regions of the stream of shredded tobacco which will later be cut for forming the individual cigarettes and will thus constitute the ends of these cigarettes.

A further preferred embodiment of the present invention is utilized in preparing filter material. In particular, a fluid additive such as a softener may be added to the basic filter substance. Both components must be mixed in an exact ratio, the maintenance of the correct ratio per unit length being of particular interest. In this case too, the control of the basic filter material or that of the moisture added can be carried out using the measurement signals of the present classifying invention.

The signals can of course also be utilized to remove tobacco which does not conform to predetermined standards from further processing. They can further be utilized to activate indicators or arrangements which keep a record of the amount of tobacco whose mass and/or moisture content falls within predetermined limits. The resulting classified values can be stored over a shorter or longer time period and furnish a good indication of the distribution of the monitored value throughout the processing time.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS:

FIGS. 3a, 3b and 3c are detailed circuit diagrams of the different components in the block diagram of FIG. 2;

FIG. 4 is a diagram showing the application of the present invention for controlling the mass of tobacco and the moisture contained therein;

FIG. 6 is a diagram showing the application of the measuring method of the present invention for controlling the juncture of two different tobacco streams to a constant ratio;

FIG. 7 is a diagram showing the application of the measuring method of the present invention to a conditioning arrangement adding moisture to tobacco; and FIG. 8 is a diagram showing the capacitive measuring arrangement of the present invention used in conjunction with the drying arrangement for tobacco.

Figure 1:
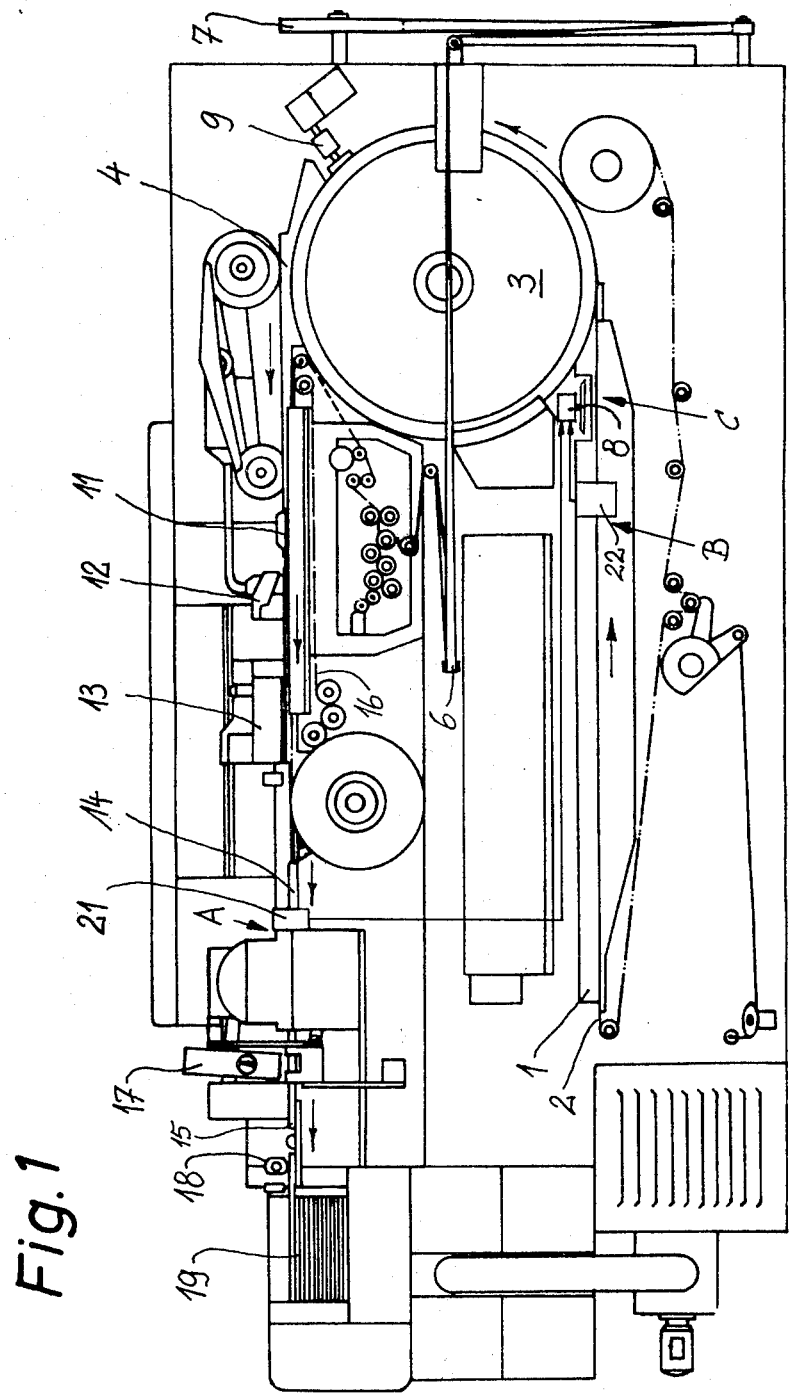
FIG. 1 is a schematic diagram showing a cigarette machine including the capacitive measuring arrangement in accordance with the present invention.

DESCRIPTION OF THE PREFERRED EMBODIMENTS:

A preferred embodiment of the present invention will now be described with reference to the drawing.

FIG. 1 shows a typical cigarette machine in which the present invention is utilized and whose construction and functioning will be briefly described. Shredded tobacco is applied by means of a channel 1 onto a moving conveyor belt 2 on which it is maintained by suction. The tobacco then travels through a groove in a conveyor disc 3, again being maintained by suction. From the groove it is taken up by a conveyor belt 4 which transfers the tobacco from the groove, the tobacco hanging on the lower side of the conveyor belt, again under the influence of suction. While it is hanging on the underside, it is applied to a cigarette paper strip 6 which is continually drawn from a bobbin 7. The amount of tobacco remains substantially unchanged from the time it is taken up in channel 1 until the time it is applied to the cigarette paper 6 except that possible excesses are removed. The tobacco thus constitutes a so-called tobacco stream or tobacco filling strand. The strand can undergo some variation in mass as well as in its relative moisture content. Two means for removing excessive tobacco are adjacent the path of the tobacco. These comprise leveling means 8 and 9. Leveler 8 is associated with channel 1, while leveler 9 is associated with disc 3. Each of these comprises a circular knife. The cutting plane of the circular knife or leveler 8 is adjustable relative to the tobacco conveyor belt 2 so that more or less tobacco can be taken from the stream in channel 1. the tobacco strand is surrounded with the cigarette paper strip 6 in a shaper 11. One edge of the paper has glue applied to it by means of glueing apparatus 12. Heater 13 dries the glue in the paper so that a finished cigarette strand 14 leaves the conveyor belt 16. The latter conveys the tobacco with the cigarette paper through shaper 11. A rotating measuring apparatus 17 cuts cigarettes 15 from the continuous covered cigarette strand 14. The so-formed cigarettes are separated from each other by an accelerator 18 and moved into the flutes in a distributor drum 19 from which they are then moved to locations for further processing.

A measuring station A with a capacitor measuring arrangement 21 (see also FIGS. 2, 3a, 3b and 3c) is located between belt 16 and the measuring apparatus 17 and thus operates on the finished cigarette strands 14. The output of the measuring arrangement 21 is connected to a control arrangement for leveler 8 so that if the measured value exceeds a predetermined value, the distance between the cutting plane of the circular knife of leveler 8 relative to the conveyor belt 2 is decreased while if the measured mass is too low it is increased in such a manner that the mass per unit length of the tobacco strand remains constant. In this way the mass of the stream is kept to a true constant value since the result of the controlled process is always monitored by the measuring arrangement 21.

A measuring arrangement 22 located at location B where paper has not yet covered the tobacco could of course also be provided.

Figure 2:
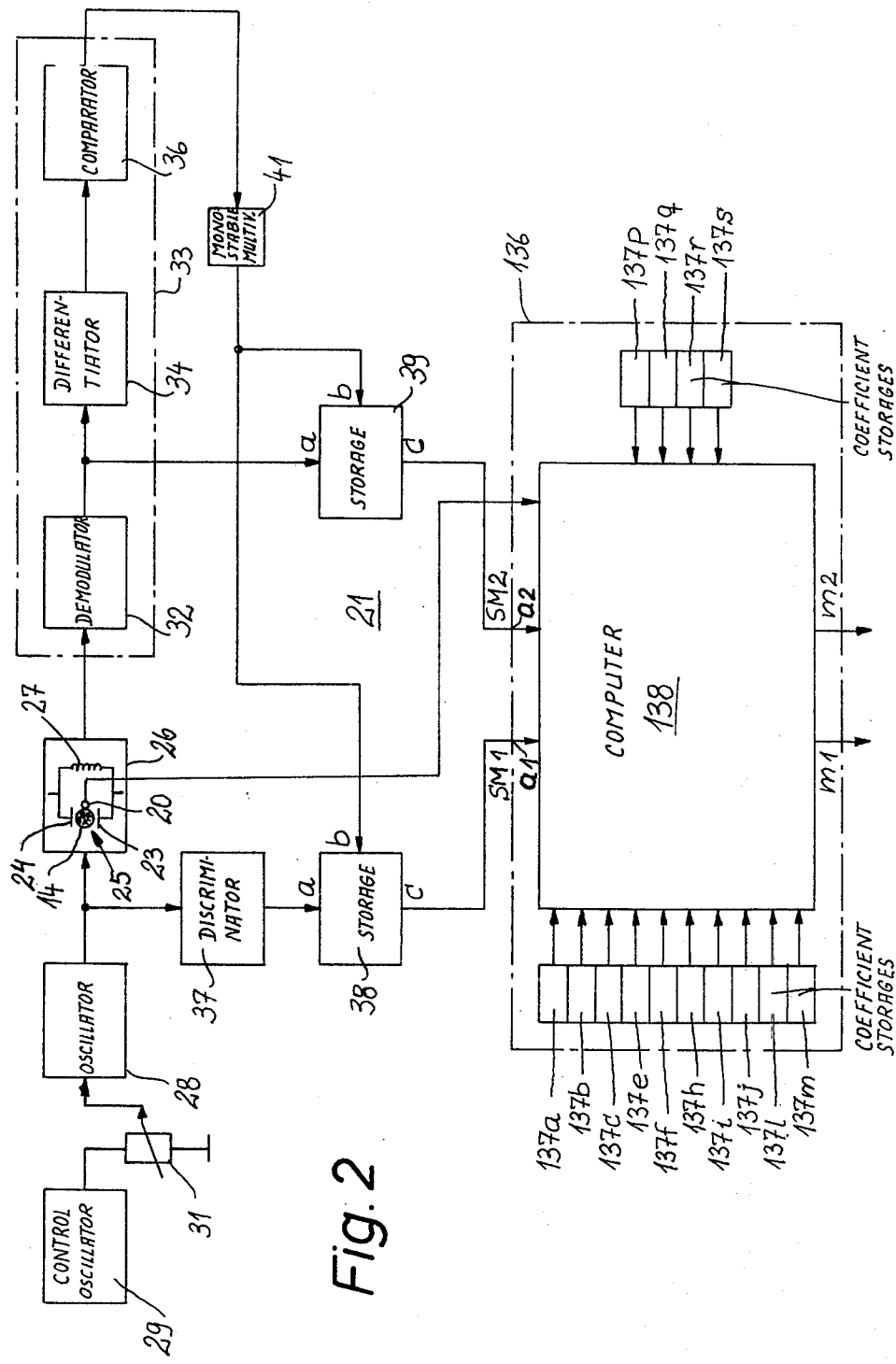
FIG. 2 is a block diagram of the measuring arrangement of FIG. 1.

FIG. 2 shows the principle of the capacitive measuring arrangement 21 of FIG. 1 which is used to determine the mass M1 and the mass M2 of the material tobacco and its associated substance, namely the moisture contained therein. Electrodes 23 and 24 of measuring capacitor 25 are positioned on two sides of the tobacco strand 14, so that a homogeneous electric field is created between the electrodes when a voltage is applied thereto. The measuring capacitor 25 forms the capacitance of an electrical high-frequency oscillator circuit which further comprises a coil 27. The ohmic resistance of the circuit 26 is not shown.

The high-frequency oscillator circuit 26 described above is connected with a carrier frequency oscillator 28 which, in a preferred embodiment, oscillates at a frequency of 10 MHz. Control oscillator 29 via a potentiometer 31 wobbles the frequency of oscillator 28 periodically at a frequency of 1KHz between two boundary values. The maximum frequency excursion between the two extreme values is so chosen that circuit 26 is certain to be in resonance within this range. Thus for each frequency excursion of oscillator 28 from a minimum to a maximum frequency, oscillator 26 will be in resonance at least once. Specifically, control oscillator 29 operates at the constant frequency which, as stated above, in a preferred embodiment is 1KHz. The amplitude of the output of control oscillator 29, which is adjustable by means of potentiometer 31, determines the range of frequency excursion of oscillator 28. The base frequency of 10 MHz of oscillator 28 and therefore the resonant frequency of circuit 26 must be chosen sufficiently high that sufficiently high signal outputs are produced.

A resonance detecting circuit as denoted by reference numeral 33 is connected to the output of high-frequency oscillator 26. This comprises a demodulator stage 32 connected to the output of oscillator circuit 26. The demodulator stage 32 furnishes an output corresponding to the envelope of the signal applied at its input to a differentiator stage 34. The outpt of differentiator stage 34 will of course be a zero signal when the output of demodulator stage 32 passes through a maximum or a minimum. The output of differentiator stage 34 is applied to the input of a comparator 36 which in turn furnishes an output when the zero signal is applied to its input. The output of comparator 36 is thus a signal which signifies that oscillator circuit 26 is at resonance. This signal is applied to a monostable multivibrator 41 which serves as a pulse former. The output of monostable multivibrator 41 is applied to the enabling input b of a storage 39. The signal stored in storage 39 is a signal a which is the output of the demodulator at the time a signal is furnished at the output of multivibrator 41, that is at the time that circuit 26 is in resonance. The signal stored in storage 39 is herein referred to as the attenuation signal, namely a signal corresponding to the amplitude of the oscillation at the output of stage 26 when it is in resonance.

Further, a discriminating stage 37 is connected to the output of oscillator 28. The discriminator stage 37 furnishes a voltage whose amplitude varies as a function of the frequency of the signal applied to its input. A signal at the output of stage 37 is thus a signal whose amplitude varies as a function of the frequency applied to circuit 26. The output of discriminator stage 37 is applied to the input of a storage 38 whose enabling input b is also connected to the output of monostable multivibrator 41. The signal stored in storage 38 is thus a signal corresponding to the frequency at resonance of circuit 26. The resonant frequency of circuit 26 of course depends upon its capacitance, since the same coil 27 is used throughout. The signal stored in storage 38 is thus what is herein referred to as the capacitance signal, namely a signal having an amplitude corresponding to the capacitance of the measuring capacitor 25 when the high-frequency oscillator circuit is at resonance.

These signals, labelled SM1 and SM2 in FIG. 2, namely the capacitance and attenuation signals respectively, are applied to the inputs of a computer 138 which will be discussed in greater detail below.

Figure 3A:
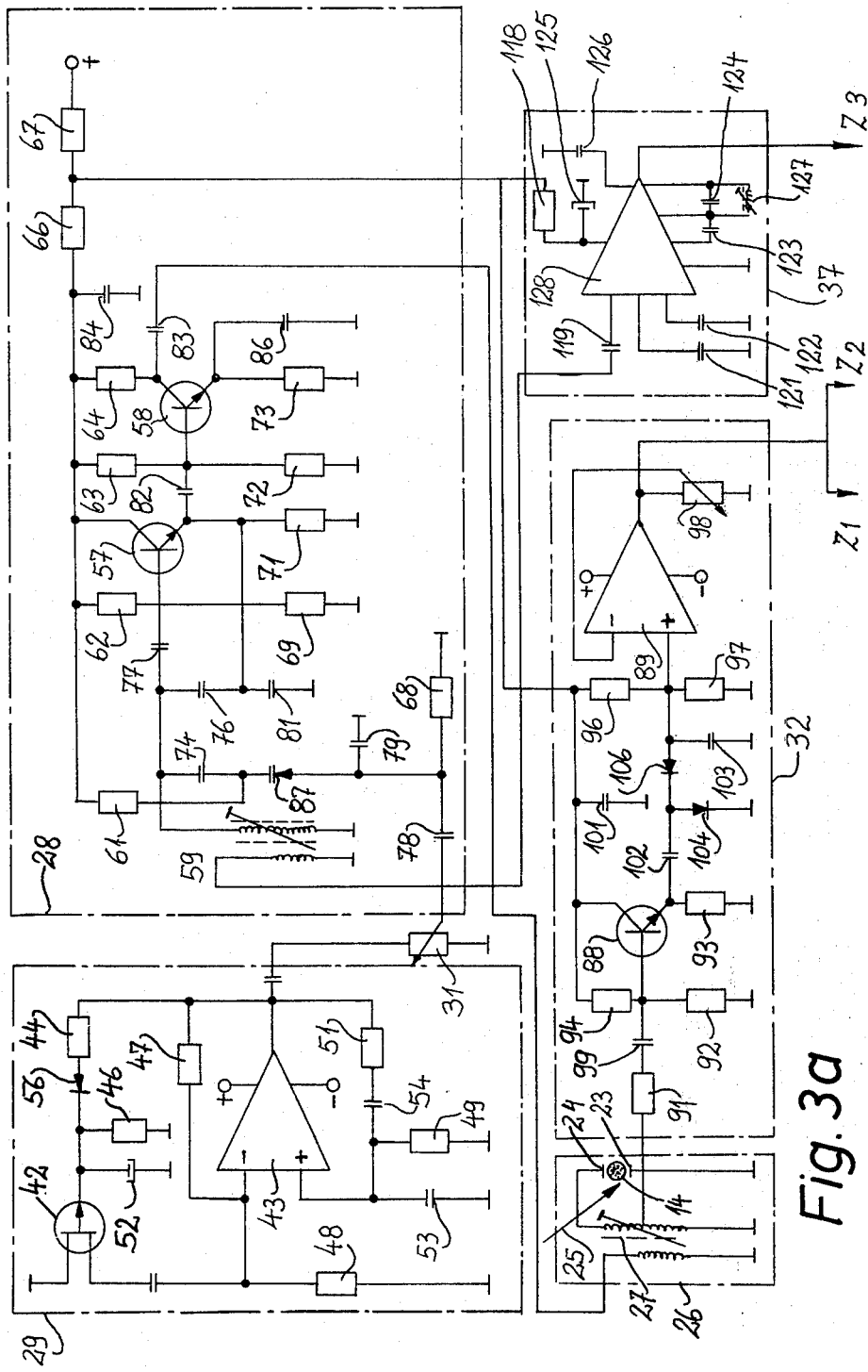

FIGS. 3a, 3b and 3c show the blocks of FIG. 2 in greater detail. Specifically, each block of FIG. 2 is shown in dash lines in FIGS. 3a, 3b and 3c, each of the blocks being denoted by the same reference numeral as in FIG. 2. Specifically, stages 26, 28, 29, 31 and 37 are shown in FIG. 3a, FIG. 3b shows stages 34 and 36, while FIG. 3c shows storages 38 and 39.

Control oscillator 29 comprises a field effect transistor 42, an operational amplifier 43, resistors 41–44, 46–49 and 51, capacitors 53 and 54 and a diode 56.

Carrier frequency oscillator 28 comprises transistors 57 and 58, a coupling coil 59, resistors 61–64, 66–69 and 71–73 capacitors 74, 76–79, 81–84 and 86 and a capacitance diode (variactor-diode) 87. The capacitance of such a diode varies as a function of the voltage applied thereto.

The voltage applied thereto is determined by means of potentiometer 31, which as previously stated controls the amplitude of the 1KHz output of control oscillator 29. The maximum amplitude of the voltage applied to the capacitance diode 87 of course determines the maximum frequency excursion of oscillator 28. In a preferred embodiment of the present invention this is taken to be 1MHz. The frequency of oscillator 28 in this particular example will thus vary periodically (at a frequency of 1KHz) between the values of 9 and 11MHz.

High-frequency oscillator circuit 26 includes the coupling coil 27 which also simultaneously constitutes the inductivity for the oscillator circuit. It further comprises the above-described measuring capacitor 25 whose dielectric is formed by the cigarette strand 14 which of course is between the above-described electrodes 23 and 24.

The demodulator stage 32 comprises a transistor 88, an operational amplifier 89 which is used only as an impedance changing stage, resistors 91–94 and 96–98, capacitors 99 and 101–103 and diodes 104 and 106.

The differentiator stage 34 comprises an operational amplifier 107 used to rotate the phase of the signal applied thereto, resistors 108, 109, 111, 112 and capacitors 113 and 114.

Comparator 36 includes a resistor 116 and an operational amplifier 117 having a very steep characteristic curve and therefore for all practical purposes acting as a switching stage which is switched to its final state for extremely small input signals. A change of stage in a predetermined direction causes monostable multivibrator 41 to switch to its monostable state wherein it furnishes a pulse having an exactly determined amplitude and width. This pulse is applied to the enabling input of both storages 38 and 39.

Discriminator stage 37 includes a special building block 128 which may for example be type TAA-661 of the firm SGS Deutschland GmbH., Wasserburg (Inn). Connected to block 128 are a resistor 118, capacitors 119–126 and a coil 127. Such a building block furnishes a signal at its output (denoted by Z3( which has an amplitude proportional to the frequency of the input signal.

Storages 38 and 39 are of similar construction. Each comprises a rapidly acting electronic switch 129, a storage capacitor 131 and an operational amplifier 132 having a very high impedance input. Switch 129 responds to a signal from monostable multivibrator 41. Switch 129 opens to transmit signals from its input, labelled a, to the input of operational amplifier 132 only during the time of application of the signal at its enabling input b, so that the voltage developed across capacitor 131 depends exactly on the voltage applied at input a.

Operational amplifiers 43, 89, 107, 117 and 132 can be of the type LM741 of the National Semi-Conductor Corporation.

The signals at the c outputs of storages 38 and 39 are thus the signals, labelled SM1 and SM2 which, as mentioned above, constitute the capacitance and attenuation signals respectively. These will now be discussed in greater detail.

The capacitance signal SM1 of course varies as a function of the capacity of the measuring capacitor 25. This capacitance varies as a function of the dielectric constants of thee mass of the tobacco in the cigarette strand 14 as well as the mass of moisture contained in said tobacco. The effect of the cigarette paper is constant and may be taken into consideration by use of a proper corresponding constant. The resonant frequency of circuit 26 thus varies as a function of the dielectric constant.

The signal SM2, which corresponds to the amplitude of the 1KHz voltage across circuit 26 at resonance is of course a measure for the attenuation in said circuit. This is determined by the ohmic loss in the dielectric of measuring capacitor 25. The ohmic loss is also variable as a function of both the mass of the tobacco in strand 14 and the moisture contained therein.

The dielectric constant and the ohmic losses have different physical properties which are affected differently by the material (tobacco) and the associated substance (moisture) in the electric field of the measuring capacitor. In other words the variations in the mass of the tobacco and moisture affect the characteristic values (dielectric constant and ohmic loss) of the high-frequency oscillator circuit differently.

Since thus the dielectric constant as well as the loss angle of the dielectric of the measuring capacitor 25 vary as a function of variation of tobacco mass and mass of moisture contained therein, but to a different degree, the capacitance and attenuation signals SM1 and SM2 may be utilized for an automatic computation of the mass M1 of the tobacco and the mass M2 of the moisture contained therein.

The computation of mass in the mass furnishing means 136 takes place in view of the following considerations:

A functional relationship exists between the masses M1, M2 and the signals SM1 and SM2, namely the capacitance and attenuation signals. In general this can be expressed by the means of a polynomial as follows:

$$M_1 = a + b.SM_1 + c.SM_1^2 + d.SM_1^3 + \\ + n_{11}.SM_1^n + e.SM_2 + f.Sm_2^2 + g.SM_2^3 + \ldots + n_{12}.SM_2^n$$

$$M_2 = h + i.SM_1 + j.SM_1^2 + k.SM_1^3 + \\ + n_{21}.SM_1^n + l.SM_2 + m.SM_2^2 + o.SM_2^3 + \\ + n_{22}.SM_2^n$$

For the solution of the above equations the relationship between $M_1$, $M_2$, $SM_1$ and $SM_2$ must first be determined. This can be done as follows: First, the mass M2 is kept constant, that is the moisture content of the tobacco is kept constant. The measuring signals $SM_1$ and $SM_2$ associated with different values of M1, that is with different values of the tobacco mass at constant moisture content are then measured. A first family of curves is thus generated. In similar manner, the mass, M1, of the tobacco is held constant while the mass, M2, that is the mass of the moisture content is varied and the associated signals SM1 and SM2 are measured. A second family of curves is thus generated.

A matrix of the above-described polynomials is then formed with powers of SM1 and SM2 which correspond to the number of measured values of SM1 and SM2. Constants $a \ldots n22$ can be derived from this matrix by means of a commercial calculator. Model 30 of series 9800 of Hewlett-Packard is suitable for this purpose. Computations to different powers of SM1 or SM2, that is on the basis of a different number of measured values, show immediately how far the computation must be carried out, that is when the values associated with higher powers of SM1 or SM2 become negligible. It may be assumed that third power terms are already negligible so that only the coefficients $a$–$c$, $e$, $f$, $h$–$j$, $i$ and $m$ must be computed as constants carrying out the computation of masses M1 and M2 on the basis of measuring signals SM1 and SM2.

The above-named coefficients are stored in coefficient storages 137a–137c, 137e, 137f, 137h–137j, 137l, 137m and are applied within each computing cycle to computer 138 at whose inputs $a_1$ and $a_2$ measuring signals SM1 and SM2 are applied. The computer is programmed to carry out the computation of the above polynomials cyclically on the basis of the constants stored in storages 137a–137c, 137e, 137f, 137h–137j, 131l, 131m and the signals applied at inputs $a_1$ and $a_2$. Computer programs for the calculation of polynomials given constant coefficients and including the squaring of the variables are well known and, as stated above, can be implemented on a Hewlett-Packard calculator. The signals at outputs $m1$ and $m2$ of computer 138 are signals corresponding to the mass M1 of the tobacco and the mass M2 of the moisture contained therein.

Unfortunately, the results of capacitor measuring methods as described above are affected greatly by variations in temperature. Since temperature variations in the material being measured cannot be avoided, a further preferred embodiment of the present invention includes a compensation for the temperature effect. A temperature-measuring arrangement for measuring the temperature of the material whose mass is to be determined is located at a position 20 in FIG. 2. The polynomials for M1 and M2 are now increased to include powers of a further measuring signal, namely a temperature measuring signal $t$. This will be explained using as an example a second order polynomial for measuring signals SM1 and SM2. The desired function will now be the following:

$$M_1 = a + b.SM_1 = c.SM_1^2 + e.SM_2 + f.SM_2^2 + \\ p.t + q.t^2$$

$$M_2 = h + i.SM_1 + j.SM_1^2 + l.SM_2 + m.SM_2^2 + r \\ .t + s.t^2$$

Again by use of a computer or calculator, the variation of the masses M1 and M2 as a function of temperature may be computed so that the constant $p \ldots s$ can be determined and stored in storages 137p ... 137s. If necessary, higher orders of the temperature signal $t$ may also be utilized. In this way the temperature effect on the measured signals may be eliminated.

The present invention is not to be limited to its implementation by nth order polynomials. It is of course equally possible that, starting with a family of curves wherein one mass is held constant and one varies, mathematical functions which have a similar variation may be chosen and, by means of a curve-fitting procedure, a satisfying mathematical expression can be found which then, with corresponding constants which are stored as are the polynomial constants in the present embodiment, can then be utilized to automatically compute the mass of moisture and tobacco, given the measured signals SM1 and SM2.

Alternatively, the constants may be determined by continuously feeding families of curves by means of a scanning process through specialized input apparatus into a computer which then automatically furnishes the desired functional relationship and the optimum constants therefor by a curve fitting technique.

Where different types of tobacco and different types of associated substances are to be processed, the polynomials and constant coefficients should be separately determined for each tobacco type, etc. The process is made simpler by the fact that while individual tobacco mixtures differ strongly from one another, each in itself remains homogeneous and constant. If what is of interest is not the absolute mass of the tobacco and the associated substance, but only the relative ratio of the two, a measuring capacitor having a non-homogeneous field, such as one disclosed in German Offenlegungsschrift No. 2,146,386 may be used.

Block 136 of FIG. 4 corresponds exactly to unit 136 indicated in dash lines in FIG. 2. The outputs of unit 136 are denoted by reference numbers $m1$ and $m2$. First, the signals on line $m1$ and $m2$, namely the signals corresponding to the mass of the material and its associated substance respectively are applied to indicator arrangements 141 and 142. Further, the signal is applied to an adder stage 144 wherein they are added and at whose output thus appears a signal corresponding to the combined mass of the tobacco and its associated moisture. This signal can be applied to an indicator 143. Optional electronic switches 146, 147 and 148 are indicated by phantom lines. These switches may be used in such a manner that the indications on indicators 141, 142, 143 each correspond to particular regions of the cigarette strand 14 (FIG. 1). For example it may be desired to indicate the masses of the cigarettes in those locations which will later form the ends of the individual cigarettes. For this purpose a timing disc 151 of a timer 152 driven in synchronism with the transport means which advance the tobacco stream is utilized to furnish timing signals. The timing signals from a proximity switch 149 open switches 146–148 at the correct time intervals so that the desired indication, that is the indication for a particular region of the cigarette, will be shown on the indicators. Instead of or in addition to indicators 141–143, the measuring signals can also be applied to classifying arrangements which indicate how long a portion of a strand falls within predetermined mass, moisture and combined mass regions.

The signal corresponding to the mass of the tobacco can also be applied to the input $a$ of a comparator 153. A reference signal is applied by means of a potentiometer 154 to the $b$ input of the comparator 153. The output of the comparator 153 will thus be a signal which is proportional to the difference between the actual mass of tobacco in the stream and the desired mass. Each control signal can serve to control the position of leveler 8 (FIG. 1) relative to channel 1 so that its cutting plane is advanced towards the conveyor belt when the error signal indicates that the mass of tobacco exceeds a predetermined mass and can be lifted away from channel 1 when the error signal indicates that the measured mass is smaller than a predetermined mass. Leveler 8 thus removes a greater or a lesser excess of tobacco from the stream in channel 1. This control of the leveler 8 can of course take place either by itself or in addition to its dependence on the signal from the measuring arrangement 22 which is constructed substantially as that denoted by reference numeral 21 and which measures the mass of tobacco upstream of the location of leveler 8.

Further, the control or error signal may be used as an input to a threshold circuit 156. If the error exceeds a predetermined error, an error signal is supplied to shift register 157. This error signal is shifted through the shift register in synchronism with the remainder of the operation of the equipment, namely under control of pulses from switch 149. Following its shift through the last stage of shift register 157, it is amplified in an amplifier 158 and applied to the solenoid 159 of a valve installed in a line 161 forming the connection between a compressed air source 162 and an ejector nozzle 163. The air from the nozzle 163 serves to separate the cigarettes which have been manufactured from the portion of the tobacco stream which had the incorrect mass from the remainder of the cigarettes. This can be accomplished at a predetermined location within the machine shown in FIG. 1 or else in a subsequent machine, for example the machine which serves to add the filter to the finished cigarette.

The present invention which has been illustrated in its application to cigarette machines can of course be utilized equally successfully in cigar manufacturing machinery.

Figure 5:
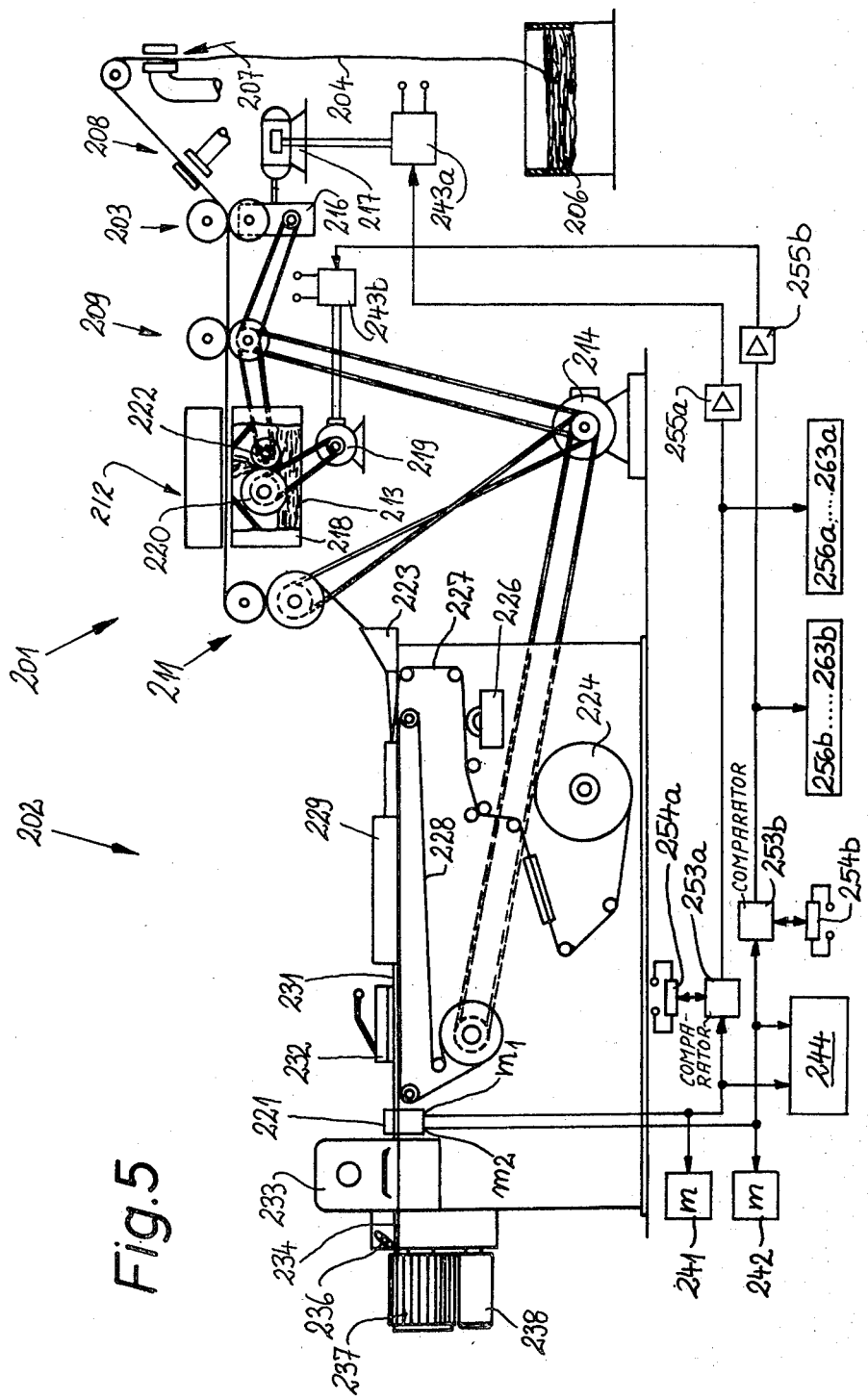
FIG. 5 is a diagram showing the application of the capacitive measuring arrangement of the present invention for determining the mass of filter material and the moisture content thereof.

FIG. 5 shows the application of the capacitive measuring method and arrangement in accordance with the present invention to a filter manufacturing machine which manufactures the rod-shaped filters of the tobacco manufacturing industry. These machines are well known and may for example comprise two main structures, a first unit 201 for processing a tow 204 which is fed in an endless strip to the machine and a second unit 202 for the manufacture of a wrapped filter rod 231.

The first unit 201 comprises a pair of rollers 203 which serve to continually pull the endless tow 204, for example filter material made of acetate, from a foil 206. Before the tow 204 reaches the pair of rollers 203, it passes by two bonding devices 207 and 208 which serve to loosen the webbing. Two additional roller pairs, 209 and 211 follow roller pair 203 along the path of the tow. The tow is stretched between rollers 209 and 211 so that a spray arrangement 212 positioned between the rollers can successfully apply softener or plasticizer 213 to the material. Preferably, one of the rollers in each of the pairs 209 and 211 is a roller having grooves in its circumference, while the roller with which it is paired has a smooth surface made of elastic material. A main motor 214 drives all of the pairs of rollers. The rotational speed of roller pair 203 is less than that of roller pair 209 and may be changed by means of a transmission 216 whose gear ratio can be changed by means of a controllable servomotor 217. The spray arrangement 212 comprises a container 218 containing softener or plasticizer 13. A drive motor 219 drives a take-off roller 220 which dips into container 218. A rotating brush cylinder 222 removes the softener or plasticizer from the circumference of roller 220 and hurls it against the threads of the tow 204, 214 which as previously mentioned, is stretched between roller pairs 209 and 211.

The so-prepared tow 204 leaves the unit 201 and arrives in an input funnel or gathering horn 223 of unit 202. In unit 202, it is formed into a strand and is put upon a covering strip or web 227 which has been drawn from a bobbin 224 and has had glue applied to it by means of a glueing arrangement 226. Covering strip 227 and the condensed tow 204 reach a conveyor 228 which conducts both components through a wrapping unit 229 in which the covering strip 227 is put around the filter material thereby forming the endless filter rod 231. This caused to pass through a sealer 232 in which the glued edge is dried. After this, the filter rod 231 is continuously cut into individual filter plugs or filter rod sections 234 by a knife apparatus 233. Filter plugs 234 are transported by an accelerator 236 into a distributor drum 237. The direction of transport changes in the drum 237 from an axial direction to a direction perpendicular to the axes of the plugs and the filter plugs are shifted to a further conveyor 238 which transports them to units for further processing.

Capacitive measuring arrangement 221 of FIG. 5 may be constructed substantially in the same way as the measuring arrangement 21 of the preceding Figures. The only prerequisite for the applicability of the capacitive measuring method and arrangement of the present invention is that the filter material (acetate) and the liquid additive (softener) which respectively constitute the material and the substance associated therewith, effect the dielectric constant and the ohmic losses of the high-frequency oscillator circuit differently.

The signal furnished at the output $m1$ of measuring arrangement 221 constitutes a signal corresponding to the mass of the filter material in filter rod 231. The signal at the output $m2$ corresponds to the mass of the softener 213 contained in the filter rod 231. Again, both measuring signals can be applied to an indicator and/or classifier arrangement. These are denoted by reference numerals 241 and 242, respectively.

Further of course an adder 244 may be used to compute the total weight of filter rod 231.

The signals at outputs $m1$ and $m2$ are also applied to comparators 253a and 253b where they are compared with reference signals furnished by potentiometers 254a and 254b respectively. The resulting error or control signals may be used to control the quantity of filter material and/or the quantity of softener or plasticizer. For this purpose, the output signal of comparator 253a after amplification in amplifier 255a is applied to a control arrangement 243a for servomotor 217. Servomotor 217, via transmission 216, controls the supply of filter tow 204 to the actual filter manufacturing machine. The output signal of comparator 253b after amplification by amplifier 255b is applied to a control arrangement 243b for drive motor 219 which drives the above-mentioned roller 220 for plasticizer 213. Thus the mass of both the material and the substance associated therewith, filter tow 204 and plasticizer 213 may be controlled. Of course the output signals of comparators 253a and 253b can also be applied to threshold circuits each of which controls an arrangement which causes filter plug having defects to be removed from the stream. Such an arrangement which is constructed corresponding to elements 156–163 of FIG. 4, is denoted by numerals 256 . . . 263 in the present Figure. The filter plugs may be removed from the stream in dependence upon excessive deviations in the mass of the filter material (256a . . . 263a) and/or in the amount of softener (256b . . . 263b).

FIG. 6 illustrates another application of the present invention. Here it is desired that two streams of tobacco be combined in a predetermined ratio. It may be assumed that the first stream 301 comprises tobacco which is shredded from tobacco leaves and is transported along a first conveyor belt 302. To this is to be added in a constant ratio a second stream 303 which is made of shredded ribs of tobacco and is transported by a conveyor 304. The two streams are to be combined at a location 306 and the resulting mixture 307 then continues on for further processing. Because of different processing prior to the mixing operation at location 306, each of the streams may have a different moisture content. However, the desired ratio is a constant ratio taking into consideration the actual mass of tobaccos only.

For this purpose, a capacitive measuring arrangement 321a as described relative to FIGS. 2 and 3 is installed adjacent the path of the first stream 301. At its output $m1$, a signal corresponding to the mass of tobacco in stream 301 is furnished. This is to be applied as a reference signal to a control arrangement 308 in which it is multiplied by the desired ratio $m2/m1$ and the resulting desired $m2$ signal is compared to an actual $m2$ signal corresponding to the actual mass of tobacco in stream 302. The difference between the actual and desired $m2$ signals serves as an error signal for a unit 309 which controls the actual mass of tobacco in the stream 302. The actual $m2$ signal is derived from a capacitive measuring arrangement 321b positioned downstream of unit 309 along the path of tobacco stream 302. Thus the mass of tobacco in stream 302 always has the desired value relative to that in stream 301 so that the mixture at location 306 will always have the desired mass ratio of tobacco, independent of their moisture content. It should also be noted that this ratio will be correct even when the mass of tobacco in stream 301 varies, since the error signal is always derived from the actual mass of tobacco in the stream 301 and the actual mass in stream 302.

FIG. 7 is a schematic diagram showing an arrangement for keeping the moisture content of a tobacco stream 400 at a desired level. The arrangement comprises mainly a means for supplying the tobacco, namely a conveyor belt 401, a means for supplying moisture to the tobacco in the form of a drum 402, and an output conveyor 403 for conveying the moisturized tobacco towards its next processing location. Details of such a moisturizing arrangement may for example be found in U.S. Pat. No. 2,767,717. Shortly before tobacco 400 reaches drum 402, it passes through a capacitive measuring arrangement 421a which operates in accordance with the present invention. Aside from the fact that electrodes of the measuring capacitor have a somewhat different shape from that previously shown, the capacitive measuring arrangement 421a corresponds to that described relative to FIGS. 2 and 3 and furnishes signals $m1$ and $m2$ at its outputs which correspond to the mass of the tobacco and the mass of moisture therein, respectively. These measuring signals are applied to a divider 404 which creates an output signal corresponding to the ratio of moisture to tobacco. This signal is applied to one input of a comparator 406 whose other input receives a reference signal from a potentiometer 407. The signal corresponding to the difference between the signals at the two inputs of comparator 406 is applied to the $a$ input of a multiplier 408. The signal $m1$ at the output of measuring arrangement 421a is directly applied to the $b$ input of multiplier 408. Thus the signal at the output of multiplier 408 corresponds to the mass of moisture to be added. This signal is applied by an amplifier 411 to a valve 412 in a line 413 through which moisture is driven by a pump 416 from a container 414 to a nozzle 409 through which the moisture is applied to the tobacco stream as it passes through the drum 402. A further capacitive measuring arrangement 421b may be used to check the moisture content in the tobacco after it leaves the drum 402. The signal $m2$, namely the signal corresponding to the mass of moisture in the tobacco after it has left the drum 402 may also be applied to valve 412 through a feedback line.

FIG. 8 shows a drying arrangement for a tobacco stream 500. Tobacco passes from an input means, namely a conveyor belt 501 into a drying drum 502 and on to a further conveyor 503. Details of such a drying arrangement may be seen in U.S. Pat. No. 3,372,488. Shortly before the tobacco reaches drum 502, it passes through a capacitive measuring arrangement 521a which, again except for the slightly differently shaped electrodes of the measuring capacitor, the essentially as is constructed measuring arrangement 21 of FIGS. 2 and 3. Output signals $m1$ and $m2$ of arrangement 521a correspond, respectively, to the mass of tobacco and the moisture associated therewith. These signals are applied to a divider 504 which determines the ratio of moisture mass to tobacco mass. The resultant ratio is applied as an input signal to a comparator 506 where it is compared to a desired value derived from a potentiometer 507. The difference signal at the output of comparator 506 is applied to an input a of a multiplier 508 to whose input b the signal m1 is directly applied. The output signal of multiplier 508 thus corresponds to the absolute mass of the moisture which is to be removed from the stream of tobacco in the drying drum 502. It is applied through an amplifier 511 to a valve 512 which is arranged in a line 513. Valve 512 controls the amount of heating medium, that is heated steam and/or heated gas such as air, which is applied from a heat-medium generator 514 to the drying drum 502. Again, the result of the drying process can be checked by means of a second capacitive measuring arrangement 521b arranged to measure the moisture content of the stream 500b of tobacco after it leaves drum 502. Again, if the output signal corresponding to the mass of moisture derived by measuring arrangement 521b differs from a desired value, a corresponding error signal can be applied to valve 512.

Of course the present invention, as well as being applied to the processing of whole or shredded natural tobacco leaves, including any type of ribs, shredded ribs, derived from the natural tobacco, is equally applicable for determining the mass of artificially reconstituted tobacco or any kind of smokable tobacco substitutes.

Further, the invention is not to be limited to the determination of mass of tobacco and other smokable goods or filter material and/or the moisture content thereof. The masses of other combinations of materials and associated substances in the sense of the present invention can also pass between the electrodes of the measuring capacitor. For example the present invention may be utilized to determine the absolute or relative moisture in endless bands of paper, materials, etc. or for the automatic determination of the mass of a particular component in such a continuous band, for example a particular layer therein. The materials having the first and second mass can take other forms also as for example powder or granulates.

It is an advantage of the present invention that as long as the material and the substance associated therewith (which may of course be another material) influence the attenuation and capacitance of a high-frequency oscillator circuit differently, the ratio of two materials, each having an associated substance can be controlled accurately independently of the variations of the mass of each. Further this can be carried out inexpensively and with high reliability.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim as my invention:

1. A method of determining the mass of a material constituting at least a part of the dielectric of a capacitor in a high-frequency oscillator circuit, comprising the steps of producing a capacitance signal signifying the capacitance of said oscillator circuit; producing an attenuation signal signifying the attenuation of said oscillator circuit; and producing a third signal which is a function of said capacitance and attenuation signals and is indicative of the mass of said material.

2. A method as set forth in claim 1, wherein said step of producing said capacitance signal comprises producing an electrical capacitance signal having a characteristic corresponding to the resonant frequency of said oscillator circuit.

3. A method as set forth in claim 1, wherein said step of producing said attenuation signal comprises producing an electrical attenuation signal having an amplitude corresponding to the amplitude of voltage across said oscillator circuit when said oscillator circuit is at resonance.

4. A method as set forth in claim 1, further comprising the step of producing a fourth signal which is indicative of the temperature of said mass, said step of producing said third signal comprising producing said third signal as a function of said capacitance, attenuation and fourth signals.

5. A method as set forth in claim 1, wherein said material is utilized in the tobacco industry and further comprising the step of transporting said material along a predetermined path past a measuring station, said steps of producing said capacitance and attenuation signals being carried out at said measuring station.

6. A method as set forth in claim 5, further comprising the steps of producing a reference signal, comparing said third signal with said reference signal, producing a control signal as a function of the difference between said third and reference signals, and changing the mass of said material in said path in accordance with said control signal.

7. A method as set forth in claim 1, further comprising the step of producing a visual output signal corresponding to said third signal.

8. A method as set forth in claim 1, wherein a substance and said material together constitute said dielectric and said step of producing said third signal comprises producing first and second signals as a first and second function, respectively, of said capacitance and attenuation signals.

9. A method as set forth in claim 8, wherein said step of producing said capacitance signal comprises furnishing an electrical capacitance signal having a characteristic corresponding to the resonant frequency of said oscillator circuit.

10. A method as set forth in claim 9, wherein said characteristic of said electrical capacitance signal is the amplitude thereof.

11. A method as set forth in claim 10, wherein said step of producing said attenuation signal comprises producing an electrical attenuation signal having an amplitude corresponding to the amplitude of voltage across said oscillator circuit when said oscillator circuit is at resonance.

12. A method as set forth in claim 8, wherein said step of producing said first and second signals comprises storing a plurality of first constants associated with said first function, storing a plurality of second constants associated with said second function, and automatically computing said first and second signals as a function of said capacitance and attenuation signals and said first and second constants, respectively.

13. A method as set forth in claim 12, wherein each of said first and second functions is a polynomial of the $n^{th}$ degree and said constants are the coefficients in the respective polynomials.

14. A method as set forth in claim 13, further comprising the step of producing an additional signal which is indicative of the temperature of said dielectric, each of said polynomials having additional terms including said additional signal.

15. A method as set forth in claim 8, further comprising the step of producing an additional signal which is indicative of the temperature of said dielectric, said step of producing said first and second signals comprising producing said first and second signals as a first and second function, respectively, of said capacitance, attenuation and additional signals.

16. A method as set forth in claim 8, wherein said material is tobacco and said substance is the moisture in said tobacco.

17. A method as set forth in claim 8, wherein said material is a filter material and said substance is an additive.

18. A method as set forth in claim 17, wherein said additive is a liquid additive.

19. A method as set forth in claim 8, further comprising the steps of producing a reference signal, comparing at least one of said first and second signals with said reference signal, producing a control signal corresponding to the difference between said one signal and said reference signal, and controlling the combined mass of said material and said substance in dependency upon said control signal.

20. Apparatus for determining the mass of a material which constitutes at least a part of the dielectric of a capacitor in a high-frequency oscillator circuit, comprising first measuring means coupled to said oscillator circuit and arranged to furnish a capacitance signal corresponding to the capacitance of said capacitor; second measuring means coupled to said oscillator circuit and arranged to furnish an attenuation signal corresponding to the attenuation of said oscillator circuit; and computing means for providing a third signal which is indicative of the mass of said material, said computing means being connected to said first and second measuring means and including storage means for storing a plurality of constants, said third signal being a function of said capacitance signal, said attenuation signal and said constants.

21. Apparatus as set forth in claim 20, wherein said first measuring means comprises discriminator means connected to said oscillator circuit and having an output which furnishes a discriminator output voltage corresponding to the frequency of said oscillator circuit, and means for storing said output voltage when said oscillator circuit is at resonance, the thus stored voltage constituting said capacitance signal.

22. Apparatus as set forth in claim 20, further comprising controlled oscillator means for applying to said high-frequency oscillator circuit a high-frequency signal having a central frequency and oscillating around said central frequency over a predetermined frequency range, said second measuring means comprising demodulator means having an output which furnishes a demodulator signal varying as a function of the attenuation of said oscillator circuit and means for storing said demodulator signal when said oscillator circuit is at resonance, the thus stored signal constituting said attenuation signal.

23. Apparatus as set forth in claim 20, wherein said computing means comprises means for computing said third signal as a polynomial function of said capacitance and attenuation signals, said constants constituting the coefficients of said polynomial.

24. Apparatus as set forth in claim 20, further comprising means for measuring the temperature of said material and having an output which furnishes a corresponding temperature signal, and means for connecting said temperature measuring means to said computing means, said computing means further having storage locations for storing constants for computation of a temperature-compensated third signal in dependency upon said capacitance, attenuation and temperature signals and said constants.

25. Apparatus as set forth in claim 24, wherein said computing means comprises means for computing a first signal corresponding to the mass of said material and a second signal corresponding to the mass of a substance associated with said material, said first and second signals being respectively first and second functions of said attenuation, capacitance and temperature signals and corresponding constants stored in said storage means.

26. Apparatus as set forth in claim 25, wherein said material is a filter material utilized in the tobacco industry and each substance is an additive to said filter material.

27. Apparatus as set forth in claim 20, wherein said material is a tobacco stream and further comprising means for transporting said stream along a predetermined path, said measuring means being adjacent said path.

28. Apparatus as set forth in claim 20, further comprising indicator means connected to the output of said computing means for furnishing a visual indication of said third signal.

29. Apparatus as set forth in claim 20, further comprising means connected to said computing means for classifying said third signal into predetermined amplitude ranges.

30. Apparatus as set forth in claim 20, further comprising means for furnishing a reference signal and comparator means connected between said computing means and said means for furnishing said reference signal, said comparator means having an output which furnishes a control signal varying as a function of the difference between said reference signal and said third signal.

31. Apparatus as set forth in claim 30, further comprising means for transporting said material along a predetermined path including a measuring station, said capacitor being located at said station and further comprising control means responsive to said control signal and arranged to vary the mass of said material in accordance with said control signal.

32. Apparatus as set forth in claim 30, further comprising control means responsive to said control signal for changing the ratio of said material to a substance differing therefrom in accordance with said control signal.

33. Apparatus as set forth in claim 20, wherein a substance associated with said material also constitutes a part of said dielectric and said computing means furnishes first and second signals respectively constituting first and second functions of said capacitance and attenuation signals, and further comprising means for furnishing an additional signal corresponding to the ratio of said second and first signals, means for furnishing a reference signal which is indicative of the desired value of said additional signal, means for comparing said reference signal with said additional signal and for furnishing a difference signal as a function of the difference between said additional signal and said difference signal, means for multiplying said difference signal by said first signal to thereby produce an error signal which is indicative of the mass of said substance to be added or removed in order that said ratio coincide with the desired ratio, and control means responsive to said control signal for varying the mass of said substance in accordance with said control signal.

* * * * *

UNITED STATES PATENT OFFICE
CERTIFICATE OF CORRECTION

Patent No. 3,979,581        Dated September 7, 1976

Inventor(s) Joachim REULAND

It is certified that error appears in the above-identified patent and that said Letters Patent are hereby corrected as shown below:

Foremost page, line 1 of Item [54], "ARRANGEMENT" should read --APPARATUS--;
              line 6 of Item [54], "HIGH" should read --HIGH- --.
Col. 1, line 2, "ARRANGEMENT" should read --APPARATUS--;
      line 5, "HIGH" should read --HIGH- --.
Col. 4, line 21, "substracted" should read --subtracted--;
      line 26, "steam" should read --stream--.
Col. 5, line 60, "the" (first occurrence) should read --The--.
Col. 6, line 25, "tobacco" should read --(tobacco)--;
      line 32, --26-- should be inserted after "circuit";
      line 61, "outpt" should read --output--.
Col. 7, line 12, "discriminating" should read --discriminator--;
      line 47, "71-73" should read --71-73,--.
Col. 8, line 24, "Z3(" should read --Z3)--;
      line 49, "thee" should read --the--.
Col. 9, line 2, of the second formula, "1.$SM_2$" should read --$\underline{1}.SM_2$--;
      line 52, "i" should read --$\underline{1}$--;
      line 63, "131$\underline{1}$, 131$\underline{m}$" should read --137$\underline{1}$, 137$\underline{m}$--.
Col. 12, line 13, "foil" should read --bale--;
      line 33, "13." should read --213.--;
      line 36, "214" should be deleted;
      line 49, --is-- should be inserted after "This";
      line 67, "effect" should read --affect--.
Col. 13, line 31, "plug" should read --plugs--.
Col. 14, line 61, "the essentially as" should be deleted;
      line 62, --essentially as the-- should be inserted after "constructed".
Col. 17, line 39, "providing" should be changed to --producing--.

Signed and Sealed this

Twenty-fifth Day of January 1977

[SEAL]

Attest:

RUTH C. MASON
*Attesting Officer*

C. MARSHALL DANN
*Commissioner of Patents and Trademarks*